(12) United States Patent
Byun et al.

(10) Patent No.: US 12,334,357 B2
(45) Date of Patent: Jun. 17, 2025

(54) METHOD OF FORMING MATERIAL LAYER

(71) Applicants: Samsung Electronics Co., Ltd., Suwon-si (KR); RESEARCH & BUSINESS FOUNDATION SUNGKYUNKWAN UNIVERSITY, Gyeonggi-do (KR)

(72) Inventors: Kyung-Eun Byun, Seongnam-si (KR); Sangwoo Kim, Yongin-si (KR); Minsu Seol, Seoul (KR); Hyeonjin Shin, Suwon-si (KR); Minseok Shin, Suwon-si (KR); Pin Zhao, Suwon-si (KR); Taehyeong Kim, Suwon-si (KR); Jaehwan Jung, Suwon-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 268 days.

(21) Appl. No.: 17/547,626

(22) Filed: Dec. 10, 2021

(65) Prior Publication Data
US 2022/0254643 A1    Aug. 11, 2022

(30) Foreign Application Priority Data
Feb. 5, 2021    (KR) .................. 10-2021-0016843

(51) Int. Cl.
*C23C 14/06*    (2006.01)
*H01J 37/34*    (2006.01)
*H01L 21/308*    (2006.01)

(52) U.S. Cl.
CPC ...... *H01L 21/3083* (2013.01); *C23C 14/0623* (2013.01); *H01J 37/3405* (2013.01); *H01J 37/3426* (2013.01); *H01J 37/3497* (2013.01)

(58) Field of Classification Search
None
See application file for complete search history.

(56) References Cited

U.S. PATENT DOCUMENTS 5,370,778 A * 12/1994 Koo ................. C23C 14/58
                                                            204/192.15
2011/0064370 A1 * 3/2011 Abraham ............ C23C 14/48
                                                            427/523

(Continued)

FOREIGN PATENT DOCUMENTS

KR         10-1800363 B1    11/2017
KR    10-2020-0035338 A     4/2020

OTHER PUBLICATIONS

Min Yu Yin et al., "Direct Formation of 2-dimensional Molybdenum Disulfide Thin Films by RF Sputtering and Rapid Thermal Annealing on Sapphire Substrate", Journal of Semiconductor Technology and Science, vol. 18, No. 2, Apr. 2018, https://doi.org/10,5573/JSTS.2018.18.2.153.

(Continued)

*Primary Examiner* — Jason Berman
(74) *Attorney, Agent, or Firm* — HARNESS, DICKEY & PIERCE, P.L.C.

(57) ABSTRACT

A method of forming a material film includes providing a non-photosensitive mask on a substrate to expose a partial region of the substrate, forming a material film on the partial region of the substrate using a sputtering process, removing the non-photosensitive mask, and heat-treating the substrate and the material film from which the non-photosensitive mask is removed under a first gas atmosphere. The material film includes a transition metal and a chalcogen element. The sputtering process may include an RF magnetron sputtering process. The heat treatment may be performed at a higher temperature than a temperature of the forming the material film.

20 Claims, 4 Drawing Sheets

(56) References Cited

U.S. PATENT DOCUMENTS

| | | | |
|---|---|---|---|
| 2013/0217214 A1* | 8/2013 | Munteanu | H01L 21/02557 118/724 |
| 2016/0093874 A1* | 3/2016 | Stimson | C23C 14/24 118/724 |
| 2018/0219113 A1* | 8/2018 | Farshchi | C23C 14/562 |
| 2021/0305046 A1 | 9/2021 | Li et al. | |

OTHER PUBLICATIONS

Seiya Ishihara et al., Properties of single-layer MoS2 film fabricated by combination of sputtering deposition and post deposition sulfurization annealing using $(t-C_4H_9)_2S_2$, Jpn. J. Appl. Phys, 55, 06GF01, (2016).

Xiang Chen et al., "Lithography-free plasma-induced patterned growth of $MoS_2$ and its heterojunction with graphene", Royal Society of Chemistry, Nanoscale, 8, 15181, (2016).

Dae-Hyung Cho et al., "Enhanced sulfurization reaction of molybdenum using a thermal cracker for forming two-dimensional $MoS_2$ layers", Royal Society of Chemistry, PCCP, 20, 16193, (2018).

Yunfan Guo et al., "Additive manufacturing of patterned 2D semiconductor through recyclable masked growth", PNAS, vol. 116, No. 9, p. 3437-3442, (2019).

* cited by examiner

METHOD OF FORMING MATERIAL LAYER

CROSS-REFERENCE TO RELATED APPLICATION

This application is based on and claims priority under 35 U.S.C. § 119 to Korean Patent Application No. 10-2021-0016843, filed on Feb. 5, 2021, in the Korean Intellectual Property Office, the disclosure of which is incorporated by reference herein in its entirety.

BACKGROUND

1. Field

The present disclosure relates to methods of forming a material layer for use in an electronic device.

2. Description of the Related Art

A material layer used in a semiconductor device may be formed in various ways. A patterning process may be included in a process of forming the material layer. The patterning process may be performed by using a photolithography process. Among material layers used in semiconductor devices, some of the material layers may be weak to light or water, and thus, when a wet process is included in a process of forming such a material layer, the properties of the material layer may be deteriorated. Therefore, using a photolithographic process along with a wet process for forming such a material layer should be carefully determined.

SUMMARY

Provided are methods of forming a material film capable of limiting and/or preventing the deterioration in properties of a material in the formation process.

Additional aspects will be set forth in part in the description which follows and, in part, will be apparent from the description, or may be learned by practice of the presented embodiments of the disclosure.

According to an embodiment, a method of forming a material film includes: providing a non-photosensitive mask on a substrate, the non-photosensitive mask exposing a partial region of the substrate; forming a material film on the partial region of the substrate using a sputtering process; removing the non-photosensitive mask from the substrate; and heat-treating the substrate and the material film from which the non-photosensitive mask is removed under a first gas atmosphere. The material film may include a transition metal and a chalcogen element. In some embodiments, the sputtering process may include RF magnetron sputtering. In some embodiments, the heat-treating may be performed at a higher temperature than a temperature of the forming the material film.

In some embodiments, the material film may be formed at a temperature in a range from about 500° C. to about 800° C. In some embodiments, the material film may be formed at a pressure in a range from about 0.1 mTorr to about 10 mTorr. In some embodiments, the heat-treating may be performed at a temperature in a range from about 700° C. to about 1200° C. In some embodiments, the heat-treating may be performed at a pressure in a range from about 1 Torr to about 20 Torr. In some embodiments, the material layer may include a dopant. In some embodiments, the sputtering process may be performing using a target including the transition metal and the chalcogen element. In some embodiments, the target may be an undoped target. In some embodiments, the material film may be an amorphous material film or a polycrystalline material film. In some embodiments, the substrate may include one of a sapphire substrate, a silicon oxide substrate, a nanocrystalline graphene substrate, and a sulfide substrate. In some embodiments, the material film may include a transition metal chalcogenide film. The material film may be a single layer or a multilayer. In some embodiments, the transition metal may include one of Ti, Zr, Hf, V, Nb, Ta, Mo, W, Tc, Re, Co, Rh, Ir, Ni, Pd, Pt, Zn, and Sn. In some embodiments, the chalcogen element may include one of S, Se and Te. In some embodiments, the first gas atmosphere may include a chalcogen element. In some embodiments, the dopant may include one of Nb, V, and Ti.

According to an embodiment, a method of forming a material film includes: forming a material film on an exposed region of a substrate covered with a non-photosensitive mask to define the exposed region of the substrate, the forming the material film being performed using a sputtering process; removing the non-photosensitive mask from the substrate after the forming the material film; and heat-treating the substrate and the material film from which the non-photosensitive mask is removed under a first gas atmosphere. The material film may include a transition metal and a chalcogen element.

In some embodiments, the forming the material film may include radio frequency (RF) magnetron sputtering as the sputtering process. The sputtering process may be performed using a target including the transition metal and the chalcogen element.

In some embodiments, the forming the material film may be performed at a temperature in a range from about 500° C. to about 800° C., and the heat-treating may be performed at a temperature in a range from about 700° C. to about 1200° C.

In some embodiments, the forming the material film may be performed at a pressure in a range from about 0.1 mTorr to about 10 mTorr, and the heat-treating may be performed at a pressure in a range from about 1 Torr to about 20 Torr.

In some embodiments, the material film may include a transition metal chalcogenide film.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
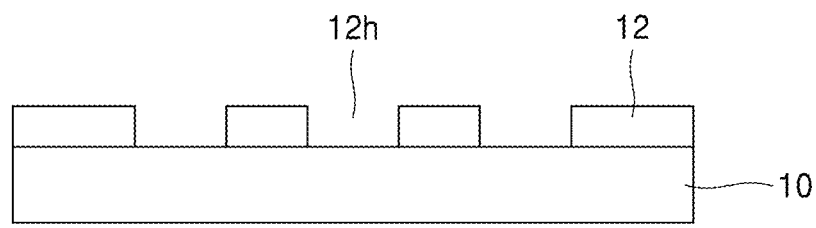
FIGS. 1 to 6 are cross-sectional views and a three-dimensional (3D) view showing a method of forming a material film according to an embodiment.

Reference will now be made in detail to embodiments, examples of which are illustrated in the accompanying drawings, wherein like reference numerals refer to like elements throughout. In this regard, the presented embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a method of forming a material film according to an embodiment will be described in detail with reference to the accompanying drawings. In this process, thicknesses of layers or regions shown in the drawings may be exaggerated for clarity of the specification. Embodiments of inventive concepts are capable of various modifications and may be embodied in many different forms. It will be understood that when an element or layer is referred to as being "on" or "above" another element or layer, the element or layer may be directly on another element or layer, or the element or layer may be on intervening elements or layers. In the following description, like reference numerals refer to like elements throughout the specification.

Figure 2:
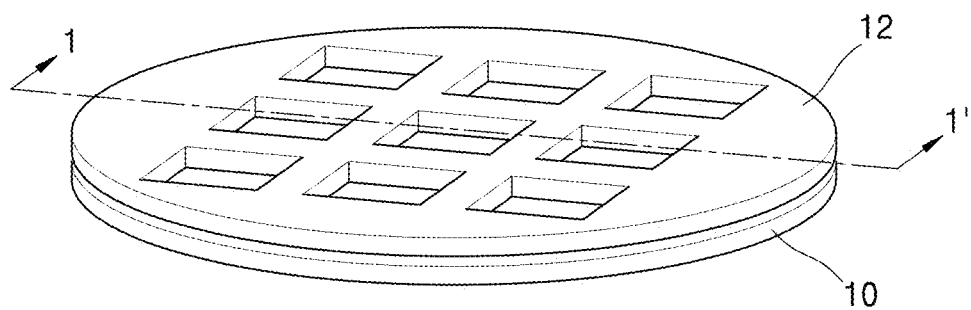

Referring to FIG. 1, a mask 12 is formed on a substrate 10 to define a region where a material film is to be deposited. In one example, the substrate 10 may include a sapphire substrate, a silicon oxide (e.g., $SiO_2$) substrate, a nanocrystal graphene substrate, or a sulfide (e.g., $MoS_2$) substrate, but is not limited thereto. In one example, the mask 12 may be a non-photosensitive mask. For example, the mask 12 may be a shadow mask. The mask 12 may be formed of a metal or metal alloy, but is not limited thereto. The mask 12 may be attached to a surface (e.g., an upper surface) of the substrate 10 on which a material film is to be deposited. The mask 12 may include at least one through hole 12h that exposes a portion of the surface of the substrate 10. A material film may be deposited on the substrate 10 exposed through the through hole 12h. Accordingly, the mask 12 may be a mask that defines a region of the surface of the substrate 10 where a material film is to be deposited, and the through hole 12h may be a factor for determining a size of the region where a material film is to be deposited. FIG. 2 shows a three-dimensional (3D) view of the mask 12 and the substrate 10 of FIG. 1. Referring to FIG. 2, the mask 12 includes nine through holes 12h, which is an example, and the number of through holes 12h may be 9 or more, or 9 or less. All sizes of the through holes 12h may be the same. Alternatively, some of the sizes of the holes 12h may be different from the sizes of other holes 12h.

Figure 3:
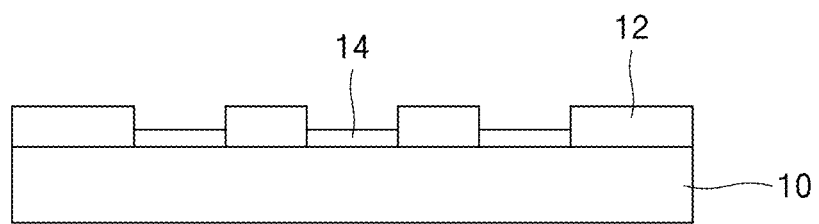

Next, as shown in FIG. 3, a material film 14 is formed on the regions exposed through the through holes 12h of the substrate 10. The material film 14 may cover the entire region of the substrate 10 exposed through the through holes 12H. A material of the material film 14 may be different from a material of the substrate 10. In one example, the thickness of the material film 14 may be less than that of the mask 12, but is not limited thereto, and the thickness of the material film 14 may be controlled in the formation process. The material film 14 may be formed in a single layer or in a multilayer. In one example, the material film 14 may include a two-dimensional (2D) material film. In one example, the material film 14 may be a transition metal dichalcogenide (TMDC) film or may include a TMDC film, but is not limited thereto. In one example, the material film 14 may be an amorphous material film or may include an amorphous material film. In one example, the material film 14 may be a polycrystalline material film or may include a polycrystalline material film. In one example, the composition of the material film 14 may be represented by $MX_{(2-a)}Y_a (0 \leq a < 2)$ (hereinafter, Formula 1). In Formula 1, M may be a transition metal. For example, M may include at least one of Ti, Zr, Hf, V, Nb, Ta, Mo, W, Tc, Re, Co, Rh, Ir, Ni, Pd, Pt, Zn, and Sn. In one example, in Formula 1, X may be a chalcogen element, and for example, may include at least one of S, Se, and Te.

Figure 4:
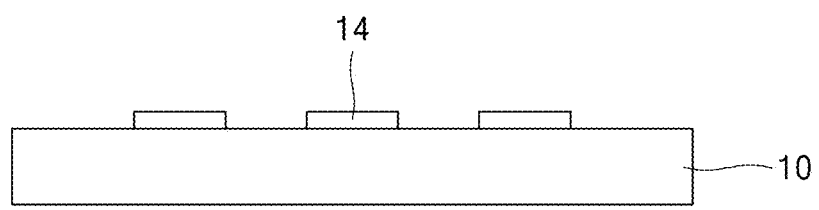

The material film 14 may be formed by using a sputtering method. The sputtering method may be performed by using a sputter. The sputter may include a commonly used sputter, for example, a Radio Frequency (RF) magnetron sputter. Ions (e.g., Ar ions) collide with a target included in the sputter, and as a result, components emitted from the target toward the substrate 10 are deposited on the substrate 10 to form the material film 14, and thus, a major component of the target and a major component of the material layer 14 may be the same. For example, when the composition of the material film 14 is $MoS_2$, the target may include $MoS_2$ or the target may be an $MoS_2$ target formed of $MoS_2$. The target may be an undoped target or a doped target. Accordingly, the material layer 14 may also be an undoped or doped material layer. In the case of a doped target, the target may include Nb, V, or Ti as a dopant. The sputtering process for forming the material layer 14 may be performed under a first temperature and a first pressure. In one example, the first temperature may be in a range from about 500° C. to about 800° C. In one example, the first pressure may be in a range from about 0.1 mTorr to about 10 mTorr. After the material film 14 is formed, the mask 12 is removed. In the sputtering method, a material may be deposited on the mask 12 as well, but the material deposited on the mask 12 may be removed as the mask 12 is removed. FIG. 4 shows the result of removing the mask 14. Referring to FIG. 4, a plurality of material films 14 separated from each other are present on the substrate 10. The plurality of material layers 14 on the substrate 10 may form the same pattern as the pattern formed by the plurality of through holes 12h formed in the mask 12.

Figure 5:
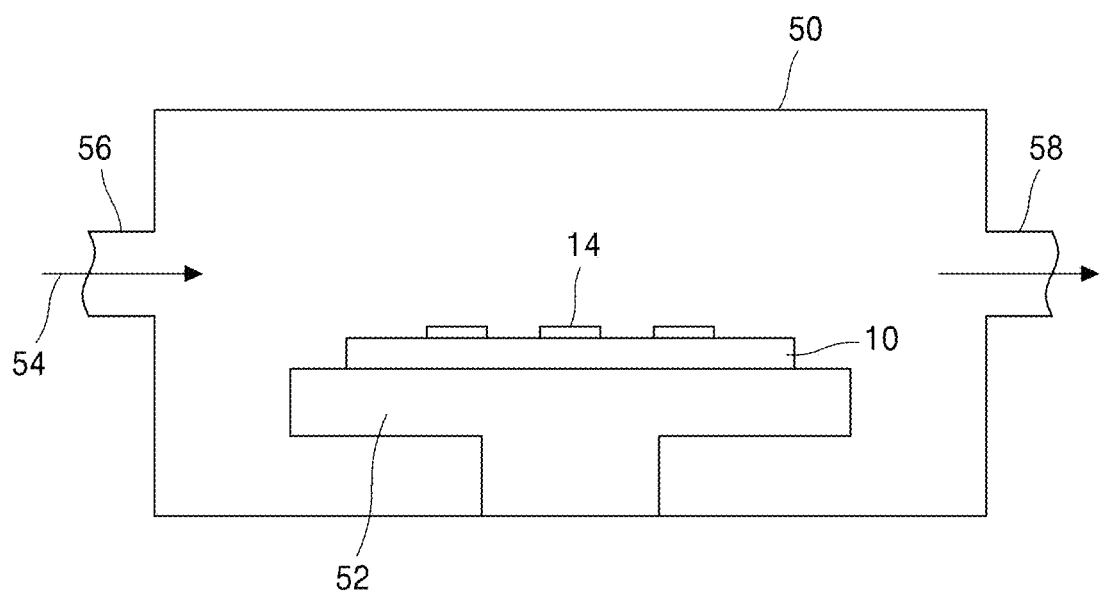
Figure 6:
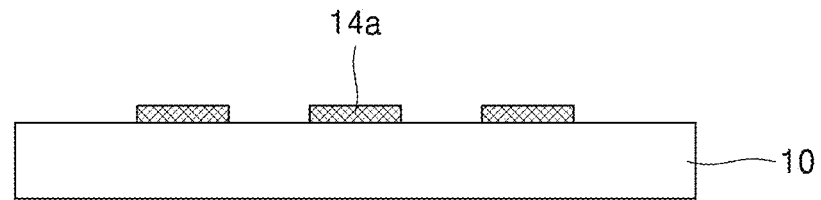

Next, a heat treatment process for increasing the crystallinity and quality of the material film 14 is performed. The heat treatment process may be performed in a chemical vapor deposition (CVD) chamber. As an example, as shown in FIG. 5, a heat treatment process may be performed after the product of FIG. 4 is loaded on a susceptor 52 of a chamber 50. The susceptor 52 may be a heating stage for supplying heat to the substrate 10. The heat treatment process may be performed in a first gas atmosphere, and may be performed under a second temperature and a second pressure. In order to create the first gas atmosphere, a first gas 54 may be supplied onto the substrate 10 through a gas inlet 56 of the chamber 50. The first gas 54 may include a chalcogen precursor. In one example, the first gas 54 may be a gas including sulfur S and may be a sulfide, for example, hydrogen sulfide $H_2S$. As a result, the first gas atmosphere may be a sulfur atmosphere. The first gas 54 may include an inert gas (e.g., Ar) with the sulfide. This inert gas may be used as a carrier gas. As the material layer 14 is heat-treated at the second temperature and the second pressure in the first gas atmosphere, the material state of the material layer 14 may be stabilized compared to before the heat treatment, and as a result, the crystallinity and quality of the material layer 14 may be improved. The second temperature may be greater than the first temperature. In one example, the second temperature may be in a range from about 700° C. to about 1,200° C. In one example, the second pressure may be in a range from about 1 Torr to about 20 Torr. In one example, the heat treatment process may be performed for 30 minutes at 1000° C. under the first gas atmosphere and the first pressure. The first gas 54 introduced into the chamber 50 may be discharged out of the chamber 50 through a gas outlet 58. After the heat treatment process is completed, the substrate 10 is moved out of the chamber 50. In this way, as shown in FIG. 6, a patterned material film 14a having high crystallinity and high quality may be formed on the substrate 10. The composition of the material film 14a undergone the heat treatment process may be expressed as $MX_2$ (hereinafter, Formula 2). M and X of the Formula 2 may be the same as described in Formula 1. The material film 14a, after undergoing the heat treatment process, may be doped or undoped.

The disclosed method of forming a material film, that is, a method of forming a patterned material film, is a dry process using a non-photosensitive mask and a sputtering method. Therefore, when the disclosed method for forming a material film is used, the deterioration in material properties that may occur when the material film is formed by using a wet process may be limited and/or prevented. In addition, in the disclosed method of forming a material film, a patterned material film is formed by using a sputtering method, and then, the formed material film is heat-treated. As a result, a material film (e.g., a TMDC film) having a high crystallinity and quality may be obtained.

The material film 14a may be used to form various electronic devices in some example embodiments. For example, FIGS. 7 to 8 are cross-sectional views showing operations in a method of forming an electronic device according to an embodiment.

Figure 7:
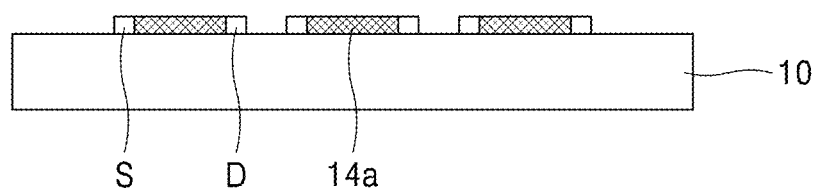
FIGS. 7 to 8 are cross-sectional views showing operations in a method of forming an electronic device according to an embodiment.

Referring to FIG. 7, after forming the material film 14a in FIG. 6, source S and drain D electrodes may connected to respective sides of each material film 14a portion on the substrate 10. The source and drain electrodes S and D may be formed by depositing a conductive layer (not shown) of a metal, a metal alloy, or other conductive material (e.g., graphene) on the substrate 10 over the material film 14a and subsequently patterning the conductive layer to provide the source and drain electrodes S and D.

Figure 8:
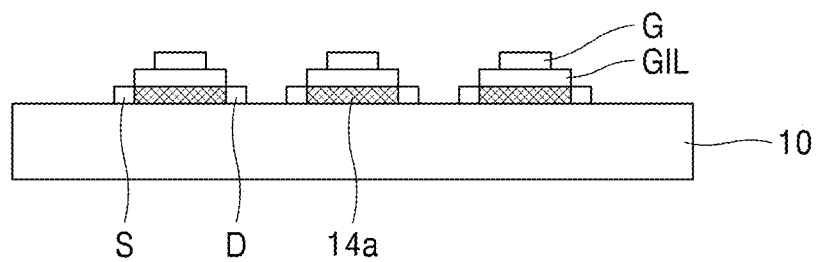

Next, referring to FIG. 8, a gate insulating layer GIL and a gate electrode G may be formed on each material film 14a portion. The gate insulating layer GIL may include an insulating material (e.g., silicon oxide, silicon nitride, hafnium oxide, aluminum oxide) and the gate electrode G may include a conductive material (e.g., metal, metal alloy, graphene). The gate insulating layer GIL and gate electrode G may be formed by depositing an insulating film (not shown) on the substrate 10 over the material film 14a portions and source and drain electrodes S and D and depositing a conductive layer (not shown) of the gate electrode G material over the insulating film. Then, separate patterning operations may be performed to form the gate electrodes G and gate insulating layers GIL.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of forming a material film, the method comprising:
providing a non-photosensitive mask on a substrate, the non-photosensitive mask exposing a partial region of the substrate;
forming a material film on the partial region of the substrate using a sputtering process;
removing the non-photosensitive mask from the substrate; and
heat-treating the substrate and the material film from which the non-photosensitive mask is removed under a first gas atmosphere to provide a heat-treated material film, wherein
the heat-treated material film is a ternary material film including a transition metal and a chalcogen element.

2. The method of claim 1, wherein the sputtering process includes radio frequency (RF) magnetron sputtering.

3. The method of claim 1, wherein the heat-treating is performed at a higher temperature than a temperature of the forming the material film.

4. The method of claim 1, wherein the forming the material film is performed at a temperature in a range from about 500° C. to about 800° C.

5. The method of claim 1, wherein the forming the material film is performed at a pressure in a range from about 0.1 mTorr to about 10 mTorr.

6. The method of claim 1, wherein the heat-treating is performed at a temperature in a range from about 700° C. to about 1200° C.

7. The method of claim 1, wherein the heat-treating is performed at a pressure in a range from about 1 Torr to about 20 Torr.

8. The method of claim 1, wherein the material film includes a dopant.

9. The method of claim 1, wherein the sputtering process is performed using a target including the transition metal and the chalcogen element.

10. The method of claim 9, wherein the target is undoped.

11. The method of claim 9, wherein the target includes a dopant.

12. The method of claim 1, wherein the material film is an amorphous material film.

13. The method of claim 1, wherein the material film is a polycrystalline material film.

14. The method of claim 1, wherein the substrate includes one of a sapphire substrate, a silicon oxide substrate, a nanocrystalline graphene substrate, and a sulfide substrate.

15. The method of claim 1, wherein the material film includes a transition metal chalcogenide film.

16. A method of forming a material film, the method comprising:
providing a non-photosensitive mask on a substrate, the non-photosensitive mask exposing a partial region of the substrate;

forming a material film on the partial region of the substrate using a sputtering process;

removing the non-photosensitive mask from the substrate; and heat-treating the substrate and the material film from which the non-photosensitive mask is removed under a first gas atmosphere, wherein the material film includes a transition metal and a chalcogen element, the material film is represented by $MX_{(2-a)}Y_a (0 \leq a < 2)$ after the forming the material film on the partial region of the substrate using the sputtering process is performed and before the heat-treating the substrate and the material film is performed, and in the $MX_{(2-a)}Y_a (0 \leq a < 2)$, M is at least one of Ti, Zr, Hf, Ta, Mo, W, Tc, Re, Co, Rh, Ir, Ni, Pd, Pt, Zn, or Sn, X is S, Se, or Te, and Y is Nb, V, or Ti.

17. The method of claim 1, wherein the transition metal includes one of Ti, Zr, Hf, V, Nb, Ta, Mo, W, Tc, Re, Co, Rh, Ir, Ni, Pd, Pt, Zn, and Sn.

18. The method of claim 1, wherein the non-photosensitive mask covers a non-exposed region of the substrate, and after the removing the non-photosensitive mask, the material film includes a plurality of material-film structures separated from each other by distances corresponding to the non-exposed region of the substrate.

19. The method of claim 1, wherein the first gas atmosphere includes a chalcogen element.

20. The method of claim 8, wherein the dopant includes one of Nb, V, and Ti.

\* \* \* \* \*